United States Patent [19]

Ohshita et al.

[11] 4,382,158
[45] May 3, 1983

[54] TONE CONTROL OF THE OPERATIONAL TYPE

[75] Inventors: Akihiro Ohshita; Keizo Okuno, both of Higashihiroshima, Japan

[73] Assignee: Sharp Kabushiki Kaisha, Osaka, Japan

[21] Appl. No.: 186,324

[22] Filed: Sep. 11, 1980

[30] Foreign Application Priority Data

Mar. 22, 1980 [JP] Japan .................................. 55-37697

[51] Int. Cl.³ ............................................... H04R 3/00
[52] U.S. Cl. .................................................... 179/1 D
[58] Field of Search ........................... 179/1 D, 1 VL; 333/28 T; 330/85, 107, 109

[56] References Cited

U.S. PATENT DOCUMENTS 3,816,661 6/1974 Huszty et al. ...................... 179/1 D
3,950,711 4/1976 Ohkawa ............................... 330/85

Primary Examiner—Joseph A. Popek
Attorney, Agent, or Firm—Birch, Stewart, Kolasch and Birch

[57] ABSTRACT

A tone control circuit for use in audio equipments includes an attenuating high pass filter (typically, a CR filter), an attenuating low pass filter, a boosting high pass filter, a boosting low pass filter and at least an operational amplifier for tone control. The high pass filters extract a treble component from an audio input signal for emphasizing or attenuating treble response, whereas the low pass filter extract a bass component of the audio input signal for emphasizing or attenuating bass response. The mid-range component of the audio input signal prevented from entering the filters by virtue of a bypass circuit interposed between a source of the audio input signal and the operational amplifier.

9 Claims, 5 Drawing Figures

TONE CONTROL OF THE OPERATIONAL TYPE

BACKGROUND OF THE INVENTION

This invention relates to a tone control of the operational type for the purpose of attenuating or emphasizing the bass and treble responses of audio equipments, and more paticularly to a tone control of the operational type which attenuates or emphasizes bass and treble responses by using a bandpass amplifier or filter directly connected to an audio-frequency amplifier.

The prior art tone controls are generally classified into the CR type as shown in FIG. 1(a) and the NF type as in FIG. 1(b). As is well known in the art, the CR type includes an input signal source 1, bass response controlling elements 3 through 7, treble response controlling elements 8 through 11 and a load resistor 12 and is interposed between input and output terminals. Operation of this circuit arrangement will now be discussed, separately, with respect to treble and bass responses.

(1) TREBLE RESPONSE

In the circuit of FIG. 1(a), the following correlation exits $$R_{1a}/R_{2a} = C_{L2a}/C_{L1a} = C_{H2a}/C_{H1a} = na$$

wherein $R_{1a}$ is the resistance of the resistor 5, $R_{2a}$ is the resistance of the resistor 3, $C_{L1a}$ is the capacitance of the capacitor 7, $C_{L2a}$ is the capacitance of the capacitor 6, $C_{H1a}$ is the capacitance of the capacitor 11, $C_{H2a}$ is the capacitance of the capacitor 9.

The moving arms of the two variable resistors 4 and 10 are so positioned that the overall resistances of the respective resistors are at the ratio of na:1. In this case, the relationship as defined by $$Z_{1a}/Z_{2a} = na$$

(the resistance of the load resistor 12 is much more higher than $Z_{2a}$) persists between an upper part $Z_{1a}$ and a lower part $Z_{2a}$ of impedance with respect to the output terminal throughout the span of audio-frequencies. Gain Aa is also defined by the following equation:

$$Aa = 1/(na+1)$$

As far as the treble response is concerned, the bass controlling capacitors 6 and 7 can be regarded as being shunted with the resistor 4.

With such an arrangement, provided that the resistance of the resistor 8 is considerably lower than that of the resistor 5 and the resistance of the resistor 10 is higher than that of the resistor 3 with the moving arm of the variable resistor 10 at its uppermost position, the gain would rise at 6 dB per octave with respect to the turning point $f_{HBa}$ $$f_{HBa} = (1/2\pi C_{H1a} R_{1a})(Hz)$$

As a consequence, the capacitive impedance of the capacitor 7 decreases to zero at relatively high frequencies to bring the input and output terminals into short-circuit relationship with a treble gain of 1.

With the moving arm at its lowest position and the resistance of the resistor 10 remarkably higher that of the resistor 5, gain decreases at 6 dB per octave with respect to the turning point as defined by $$f_{HC} = \tfrac{1}{2}\pi C_{H2a}\left(\frac{R_{1a} \cdot R_{2a}}{R_{1a} + R_{2a}}\right) + R_{3a}$$

Thus, it is possible to boost or attenuate the treble response.

(2) BASS RESPONSE

Since the capacitances of the capacitors 11 and 9 are lower than those of the capacitors 6 and 7 in FIG. 1(a), these capacitors 11 and 9 demonstrate an increase in impendance at a low frequency (bass) range. When the moving arm of the resistor 4 reaches its highest position, the resistor 2 shows a zero resistance so that gain increases at 6 dB per octave from the turning point as follows:

$$f_{LBa} = \frac{R_{2a} + R_{LVa}}{2\pi C_{L2a} \cdot R_{2a} \cdot R_{LVa}} \text{ (Hz)}$$

wherein $R_{LV}$ is the resistance of the variable resistor 4. The resulting increased gain can be written as follows:

$$A_{LBa} = \frac{R_{LVa} + R_{2a}}{(R_{1a} + R_{LVa} + R_{2a})}$$

When the moving arm of the resistor 4 is at its lowest position, gain drops at 6 dB per octave with respect to the following turning point:

$$f_{LC} = (R_{LV} + R_1 + R_2)/2\, C_{L1}R_{LV}(R_1 + R_2)$$

The resulting gain is $$A_{LC} = R_2/(R_{LV} + R_1 + R_2)$$

Attenuating or emphasizing the bass response is therefore possible.

As noted earlier, audio-frequency signals including mid-range signals which have nothing to do with tone control, flow through the capacitors in the prior art CR type tone control circuitry and especially the mid-range signals are adversely affected and become degraded in tone quantity.

Attention is turned to the other type of prior art which includes an input signal source 13, an input resistor 14, tone controlling elements 15 through 23 and an amplifier 24 with gain $A_N$. This circuit assumes a gain of 1, that is, 0 dB (provided that the moving arms of the variable resistors 17 and 21 are positioned in the center of their moving ranges) and thus manifests a flat frequency characteristic. In the following description, $R_{1b}$ is the resistance of the resistors 16 and 22, $R_{3b}$ is the resistance of the resistors 15 and 23, $R_{2b}$ is the resistance of the resistor 19, $R_{LVb}$ is the resistance of the resistor 21, $R_{HVb}$ is the resistance of the resistor 17, $C_{Lb}$ is the capacitance of the capacitors 20a and 20b and $C_H$ is the capacitance of the resistor 18.

(3) BASS RESPONSE

While considering the bass response of the circuit of FIG. 1(b) wherein the tone controlling capacitor 18 shows a high impedance, the resistances of the respective resistors 15, 23, 17 and 18 are negligible. With the resistor 14 of a zero resistance, $R_{in} = R_{out} = 0$ and the moving arm of the variable resistor 21 is moved to the $Z_1$ side of variable resistor 21, gain would rise up to $$A_{LBb}=Ab(R_{1b}+R_{LVb})/(AbR_{1b}+2R_{1b}+R_{LVb})$$

at 6 dB per octave at the turning point $$f_{LBb}=(R_{1b}+R_{LVb})/(2\pi C_{Lb}R_{1b}R_{2Vb})(Hz)$$

Contrarily, when the arm of the resistor 21 is moved to the $Z_2$ side of variable resistor 21, gain decreases down to $$A_{Lcb}=AbR_{1b}\{Ab(R_{1b}+R_{LVb})+2R_{1b}+R_{LVb}\}$$

at 6 dB per octave. Accordingly, boosting or attenuating the bass response is possible.

(4) TREBLE RESPONSE

Since the impedance of the capacitors 20a and 20b can be regarded as zero at a high frequency (treble) range, the emphasizing of the treble response is carried out to a maximum extent when the resistor 14 together with $R_{in}$ and $R_{out}$ is neglected and the moving arm of the resistor 17 is at the extremity of its span adjacent to resistor 15. The frequency $f_{HBb}$ where the treble response begins attanuating is equal to $$1/2\pi C_{Hb}(3R_{1b}+R_{3b})Hz$$

and is a maximum when $R_{2b}<3\ R_{1b}$. If $R_{HVb}+R_{2b}>3\ R_{1b}$, then gain would rise at 6 dB/oct up to $$A_{HBb}=3R_{1b}Ab/(AbR_{3b}+3R_{1b}+R_{3b})$$

Moving the arm of the resistor 17 to place it adjacent to resistor 23 provides a maximum attenuation of the treble response. In this case the turning point frequency and gain when attenuated are as follows:

$$f_{Hcb}=f_{HBd}$$

$$A_{Hcb}=R_{3b}Ab/(3R_{1b}Ab+3R_{1b}+R_{3b})$$

Gain therefore falls at 6 dB/oct. The emphasizing and attenuating of the treble response are also possible in the above mentioned manner.

The CR type tone control not only rises or drops the signal levels of the bass and treble signals through CR attenuation but attenuates the mid-range signals. Thus, the CR type tone control suffers deteriorated tone quality of the mid-range signals because it modifies in nature the mid-range signals which are unnecessary to change. This is also the case with the NF type tone control which uses negative feedback.

OBJECT OF THE INVENTION

Accordingly, it is an object of the present invention to provide improved tone control of the operational type which extracts and amplifies treble and bass signals and executes desired addition or subtraction to or from original signals for boosting or attenuating treble and bass responses through the use of an operational amplifier without any deterioration of tone quality of mid-range signals.

BRIEF DESCRIPTION OF THE DRAWINGS

For a more complete understanding of the present invention and for further objects and advantages thereof, reference is now made to the following description taken in conjunction with the accompanying drawings, in which.

DETAILED DESCRIPTION OF THE EMBODIMENT

Figure 1A:
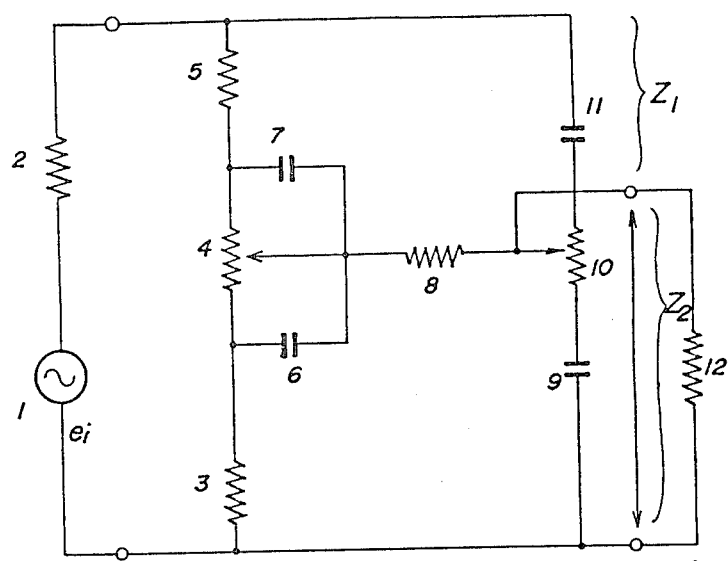
FIGS. 1(a) and 1(b) are circuit diagrams of the prior art tone controls.
Figure 1B:
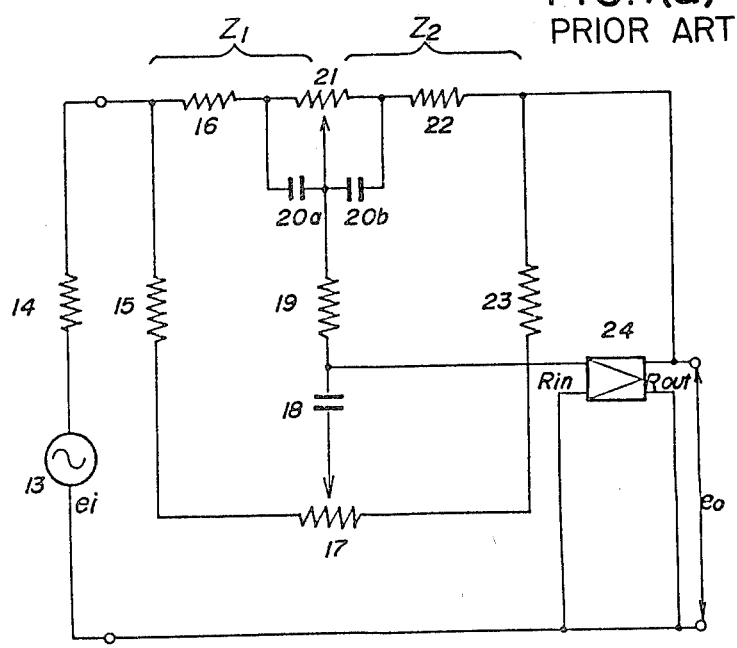
Figure 2:
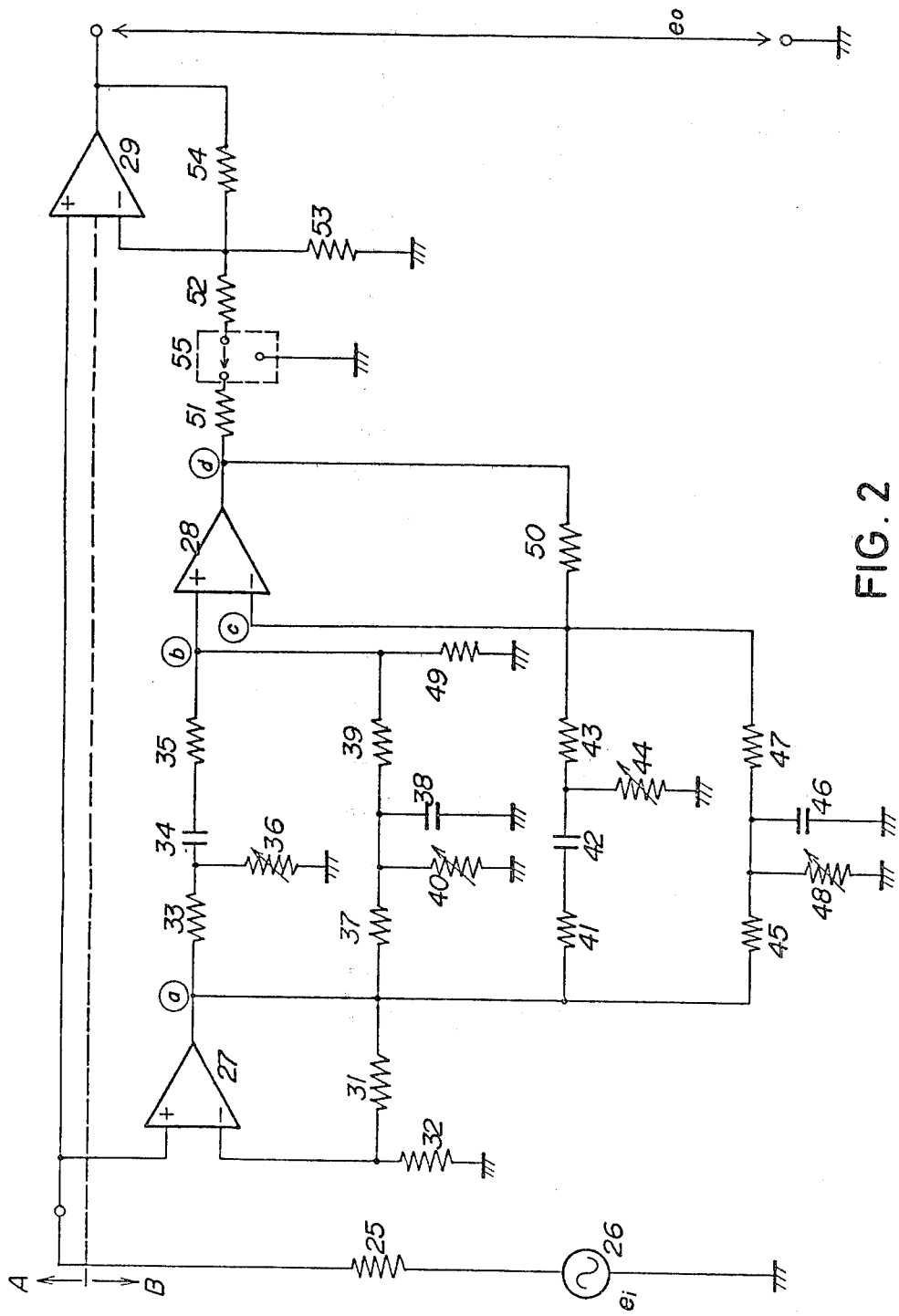
FIG. 2 is a circuit diagram of a tone control constructed according to one preferred form of the present invention.

Referring now to FIG. 2, there is illustrated one preferred form of the present invention which includes an input signal source 26, an input resistor 25 and an operational pre-amplifier 27 handling shunt current for use in tone control. An input signal flows in part into a non-inverted input terminal of the operational amplifier 27 whose output terminal feeds the reverse of the input signal back to its inverted input terminal via a resistor 31. The output terminal of operational amplifier 27 is further connected to a non-inverted input terminal of another amplifier 28 via a high pass filter (called "HPF" hereinafter) and a serially connected resistor 35, the HPF comprising a resistor 33, a capacitor 34 and a variable resistor 36 having its one terminal connected to the joint between the resistor 33 and the capacitor 34 and its opposite ground terminal. A pair of resistors 37 and 39 are serially connected with the joint being grounded via a parallel circuit consisting of a variable resistor 40 and a capacitor 38 comprise a low pass filter (LPF). The low pass filter (called "LPF" hereinafter) is connected to a resistor 49 having a grounded terminal is located lin parallel with the above mentioned HPF.

The output of the amplifier 27 is further connected serially to a resistor 41, a capacitor 42 and a resistor 43 and led to a non-inverted input terminal of the amplifier 28 via another HPF which comprises the resistor 41, the capacitor 42 and a variable resistor 44 having two opposite terminals one connected to the joint between the resistor 43 and the capacitor 42 and the other grounded. Another LPF comprising a pair of serially connected resistors 45 and 47 and a parallel circuit of a variable resistor 48 and a capacitor 46 interposed between the joint of the two resistors 45 and 47 and the ground is connected in parallel with this HPF. These HPF and LPF are therefore connected to the inverted input terminal and non-inverted input terminal of the amplifier 28, respectively. The output of the operational amplifier 28 is fed back to its inverted input terminal via a resistor 50 so that the amplifier may serve as not only an inverting amplifier but also a non-inverting amplifier. Moreover, the output of the amplifier 28 is supplied to the inverted input terminal of the amplifer 29 through a serial circuit of a resistor 51, a tone defeat switch 55 surrounded by the broken line and a resistor 52. The output of the amplifier 29 is fed back to its inverted input terminal via a resistor 54. The amplifier 29 serves as a differential amplifier which effects addition or subtraction on signals passing the side A and the control signals passing the side B, the results of addition and subtraction being in effect for the intended purposes. It is understood that the signals passing directly the side A are the very input signal $e_i$ with a flat frequency characteristic including the mid-range signals and the signals passing the side B are subject from tone control through the HPF and LPF and the operational amplifiers.

Operation of the tone control according to the present invention will be discussed in terms of attenuation and emphasis of the treble and bass responses. In the following, the resistances and capacitances of its relevant components are represented by R and C with the reference numbers as suffix. Assume that an input signal $e_i$ is applied to the non-inverted input terminal of the operational amplifier 27 which in turn provides its output $$e_a = (R_{31} + R_{32})e_i/R_{32}$$

(5) ATTENUATION OF BASS RESPONSE

When the attenuating of the bass response is desired, the variable resistors 36, 44 and 48 are short-circuited and the variable resistor 40 assumes a maximum resistance. Under the circumstance the input signal passes nothing but the LPF comprising the elements 37 through 40 and enters the non-inverted input terminal c of the operational amplifier 28. It is noted that the cutoff frequency $f_{LC}$ of the LPF is defined by $$1/2\pi\{R_{37} \cdot R_{39}/(R_{37}+R_{39})\}C_{38}$$

and typically approximately 380 Hz in the example of FIG. 2. Since gain falls at 6 dB per octave at frequencies more than the cutoff frequency, the only signal which is allowed to enter the non-inverted input terminal of the operational amplifier 28 is the bass range signals. The resistor 49 is an attenuation resistor which prevents the gain of the control section from being higher than that of the signal section. Developed at the output of the operational amplifier 28 is $$ed_1 = \frac{(R_A + R_{50}) e_a}{R_A}$$

wherein $R_A$ is the combined resistance of the parallel circuit consisting of the resistors 43 and 47 and thus $$R_A = \frac{R_{43} \cdot R_{47}}{(R_{43} + R_{47})}$$

The output of the operational amplifier 28 is then applied to the inverted-input terminal of the operational amplifier 29 via the elements 51, 55 and 52. While the operational amplifier 28 is applied to the non-inverted input terminal of the operational amplifier 29 via the elements 51, 55 and 52. As the operational amplifier 29 receives the original audio signals at its non-inverted input terminal, its output is:

$$e_{01} = \frac{(R_B + R_{54}) e_i}{R_B} - R_{54}ed_1(R_{51} + R_{52})$$

Because the output $ed_1$ is in phase with the input signal $e_i$, the bass components are subtracted from the original audio signals with the result in attenuation of the bass response. In the above equation, $$\frac{1}{R_B} = \frac{1}{(R_{51} + R_{52}) + 1} = \frac{1}{R_{53}}$$

(6) ATTENUATION OF TREBLE RESPONSE

When attenuating the treble response is necessary, the variable resistors 40, 44 and 48 are short-circuited and grounded and the variable resistor 36 is set at a maximum resistance. Accordingly, the only path through which the input signal passes is the HPF comprising the elements 33 through 36 and the input signal enters the non-inverted input terminal of the operational amplifier 28. It is understood that the cutoff frequency of the HPF is defined as $$f_{HC} = \frac{1}{2\pi(R_{33} + R_{35})C_{34}}$$

and typically approximately 2900 Hz in the example of FIG. 2. Since gain drops at 6 dB per octave at frequencies lower than the cutoff frequency, only the treble components are admitted to the non-inverted input terminal b of the operational amplifier 28. The resistor 49 serves for the same purpose as in paragraph (5).

Under these circumstances the output of the operational amplifier 28 is represented as $$ed_2 = \frac{(R_A + R_{50}) e_a}{R_A}$$

The output of the operational amplifier 28 is then applied to the inverted-input terminal of the operational amplifier 29 via the respective elements 51, 55 and 52. While the operational amplifier 29 receives the original audio signals at its non-inverted input terminal, its output is $$e_{02} = \frac{(R_B + R_{54})}{R_B} \cdot e_i - \frac{R_{54}}{R_A} \cdot ed_2$$

Because the output $ed_2$ is in phase with the input signal $e_i$, only the treble components are subtracted from the original audio signals with the result in attenuation of the treble response. In the above equation, $R_B$ is defined in paragraph (5).

(7) EMPHASIS OF BASS RESPONSE

If the emphasizing of the bass response is desirable, the variable resistors 36, 40 and 44 are short-circuited and grounded and the variable resistor 48 demonstrates a maximum resistance. Under the circumstance the input signal passes nothing but the LPF comprising the elements 45 through 48 and enters the non-inverted input terminal of the operational amplifer 28. It is noted that the cutoff frequency $f_{LB}$ of the LPF is defined by $$\frac{1}{2\pi\{R_{45} \cdot R_{47}/(R_{45} + R_{47})\}C_{46}}$$

and typically approximately 100 Hz in the example of FIG. 2. Since gain falls at 6 dB per octave at frequencies more than the cutoff frequency, only the bass range signals are admitted to the non-inverted input terminal of the operational amplifier 28. Developed at the output of the operational amplifier 28 is $$ed_3 = -\frac{R_{50}}{(R_{45} + R_{47})} \cdot e_a$$

It is noted that $ed_3$ is 180° out of phase with $e_a$ and thus the incoming audio signal $e_i$. The output of the operational amplifier 28 then enters the inverted-input terminal of the operational amplifier 29 via the elements 51, 55 and 52. While the operational amplifier 29 receives the original audio signals at its non-inverted input terminal, its output $$e_{03} = \frac{(R_B + R_{54})}{R_B} e_i - \frac{R_{54}}{R_A} Cd_3$$

$R_A$ and $R_B$ are the combined resistance in paragraph (5). As stated above, because the output $ed_3$ is out of phase with the input signal $e_i$, the bass components are added to the original audio signals with the result in desired emphasis of the bass response.

(8) EMPHASIS OF TREBLE RESPONSE

When the emphasizing of the treble response is desirable, the variable resistors 36, 40 and 48 are short-circuited and grounded and the variable resistor 44 assumes a maximum resistance. Under the circumstance the input signal passes nothing but the HPF comprising the elements 41 through 44 and enters the non-inverted input terminal of the operational amplifier 28. It is noted that the cutoff frequency $f_{HB}$ of the HPF is defined by $$\frac{1}{2\pi(R_{41}R_{43})C_{42}}$$

and typically approximately 8100 Hz in the example of FIG. 2. Since gain falls at 6 dB per octave at frequencies more than the cutoff frequency, only the treble range signals enter the non-inverted input terminal of the operational amplifier 28. Developed at the output of the operational amplifier 28 is $$ed_4 = - \frac{R_{50}}{(R_{41} + R_{43})} ea$$

It is evident that $ed_4$ is 180° out of phase of $ea$, that is, the incoming audio signals $e_i$. The output of the operational amplifier 28 is then applied to the inverted-input terminal of the operational amplifier 29 via the elements 51, 55 and 52. While the operational amplifier 29 receives the original audio signals at its non-inverted input terminal, its output is $$e_{04} = \frac{(R_B + R_{54})}{R_B} e_i - \frac{R_{54}}{R_A} ed_4$$

$R_A$ and $R_B$ are the above defined combined resistances. Because the output $ed_4$ is out of phase with the input signal $e_i$, the treble components are added to the original audio signals with the result in emphasis of the treble response.

In summary, the first portion of the input signals from the source 26 flows directly into the non-inverted input terminal of the amplifier 29 on the side A. This portion including the mid-range signals is not affected by emphasizing or attenuating adjustment. The second portion of the input signals, on the other hand, enters the tone control arrangement via the non-inverted input terminal of the amplifier 27. Of the input signals supplied to the amplifier 27, the more than 2900 Hz signals pass through the attenuating HPF and the less than 380 Hz signals pass through the attenuating LPF both of which then reach the inverted input terminal of the operational amplifier 29 with their phase unchanged. At this time the more than 8100 Hz signals pass through the boosting HPF whereas the less than 100 Hz signals pass through the boosting LPF. The thus treated signal components are eventually supplied to the non-inverted input terminal of the amplifier 28 and to the counterpart of the amplifier 29 with phase reversal. The resulting signals are mixed into the original signals. Therefore, the bass and treble responses are emphasized or attenuated as expected. As discussed previously, the mid-range signals are kept from entering the tone control circuit arrangement.

As fully discussed above, the bass and treble responses may be emphasized or attenuated in the manners as set forth in paragraphs (5)-(8) without affecting the mid-range signals. Combinations of paragraphs (5)-(8) together with appropriate selections of the resistances of the respective elements 36, 40, 44 and 48 offer the most pleasing proportion of bass to treble. The switch 55 serves to suppress noise which may come from the operational amplifier 28 when the tone control circuit arrangement is not in use.

Figure 3A:
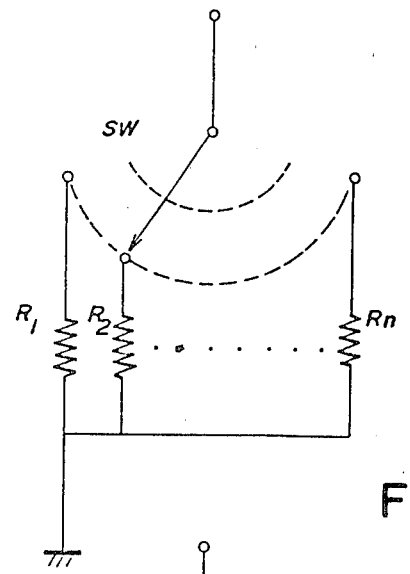
FIGS. 3(a) and 3(b) show other preferred forms of the present invention.
Figure 3B:
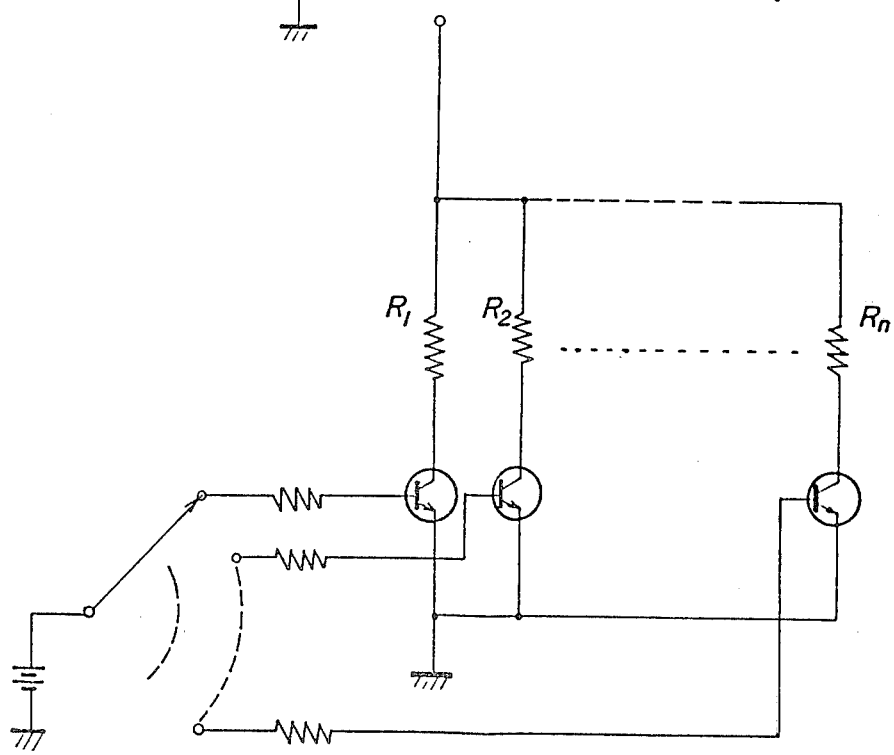

In another preferred form of the present invention a mechanical switch of FIG. 3(a) or an electronic semiconductor switch may take the place of the respective elements 36, 40, 44 and 48 for selection of the resistance value as shown in FIG. 3(b).

Whereas the present invention has been described with respect to specific embodiments thereof, it will be understood that various changes and modifications will be suggested to one skilled in the art, and it is intended to encompass such changes and modifications as fall within the scope of the appended claims.

We claim:

1. A tone control circuit for modifying an audio signal comprising:
    an input terminal;
    an output terminal;
    means for directly passing said audio signal from said input terminal to said output terminal;
    modification means for modifying said audio signal to produce a boost or attenuation signal corresponding to at least a portion of the frequency spectrum of said audio signal;
    said means for directly passing said audio signal further including means for adding or subtracting said boost or attenuation signal to said audio signal, only when desired, to boost or attenuate the portion of said frequency spectrum selected by said modification means.

2. The tone control circuit of claim 1 wherein said means for directly passing prevents alteration of portions of said frequency spectrum not modified by said modification means.

3. The tone control circuit of claim 1 or 2 wherein the portion of said frequency spectrum selected by said modification means is a bass portion or treble portion of said audio signal.

4. The tone control circuit of claim 3 wherein the portion of said frequency spectrum not modified by said modification means is a mid-range portion of said audio signal.

5. The tone control circuit of claim 4 wherein said means for directly passing includes amplifier means for controlling the gain of said audio signal.

6. The tone control circuit of claim 5 wherein said modification means variably adjusts the gain of said boost or attenuation signal.

7. The tone control circuit of claim 6 wherein said modification means further includes:

first means for attenuating only said bass portion of said audio signal;

second means for attenuating only said treble portion of said audio signal;

third means for boosting only said bass portion of said audio signal; and fourth means for boosting only said treble portion of said audio signal.

8. A tone control circuit according to claim 7 wherein said first means comprises an attenuating low pass filter, said second means comprises an attenuating high pass filter, said third means comprises a boosting low pass filter and said fourth means comprises a boosting high pass filter.

9. A tone control circuit according to claim 8 wherein said modification means further includes an operational amplifier operatively connected to said first through fourth means for tone control and to said means for adding or subtracting.

* * * * *